(12) United States Patent
Schnieders

(10) Patent No.: US 11,009,802 B2
(45) Date of Patent: May 18, 2021

(54) PELLICLE

(71) Applicant: CNM TECHNOLOGIES GMBH, Bielefeld (DE)

(72) Inventor: Albert Schnieders, Bielefeld (DE)

(73) Assignee: CNM TECHNOLOGIES GMBH, Bielefeld (DE)

( * ) Notice: Subject to any disclaimer, the term of this patent is extended or adjusted under 35 U.S.C. 154(b) by 0 days.

(21) Appl. No.: 15/545,096

(22) PCT Filed: Jan. 13, 2016

(86) PCT No.: PCT/EP2016/050513
§ 371 (c)(1),
(2) Date: Jul. 20, 2017

(87) PCT Pub. No.: WO2016/116329
PCT Pub. Date: Jul. 28, 2016

(65) Prior Publication Data
US 2018/0284598 A1    Oct. 4, 2018

(30) Foreign Application Priority Data
Jan. 23, 2015    (GB) ...................... 1501118

(51) Int. Cl.
*G03F 7/20* (2006.01)
*G03F 1/24* (2012.01)
*G03F 1/62* (2012.01)

(52) U.S. Cl.
CPC ............ *G03F 7/70983* (2013.01); *G03F 1/24* (2013.01); *G03F 1/62* (2013.01); *G03F 7/70191* (2013.01); *G03F 7/70958* (2013.01)

(58) Field of Classification Search
CPC ...... G03F 1/62; G03F 1/64; G03F 1/66; G03F 1/14; G03F 1/142; G03F 1/24;
(Continued)

(56) References Cited

U.S. PATENT DOCUMENTS 6,623,893 B1    9/2003    Levinson et al.
6,764,758 B1    7/2004    Grunze et al.
(Continued)

FOREIGN PATENT DOCUMENTS

EP    0893736    1/1999
EP    1222498 B1    9/2000
(Continued)

OTHER PUBLICATIONS

English translation of WO2015/045414, published Apr. 2, 2015 (Year: 2015).*
(Continued)

*Primary Examiner* — Christina A Riddle
(74) *Attorney, Agent, or Firm* — 24IP Law Group USA, PLLC; Timothy DeWitt

(57) ABSTRACT

A pellicle for a lithographic device and a method for its manufacture. The pellicle comprises a carbon-based film having a thickness of between 0.1 nm and 10 nm and at least one layer of cross-linked aromatic molecules, heteroaromatic molecules, or polyyne-based or polyene-based amphiphilic molecules. The carbon-based film has a periphery and a center portion and the center portion is transparent to the radiation beam. A support structure is coupled at least to the periphery of the carbon-based film.

13 Claims, 7 Drawing Sheets

(58) Field of Classification Search
CPC ............. G03F 7/70741; G03F 7/70983; G03F 7/70958; G03F 7/70908; G03F 7/70916; G03F 7/70191
USPC .............. 355/30, 50, 52, 55, 67–71, 75–77; 250/492.1, 492.2; 430/5, 311, 394; 428/14
See application file for complete search history.

(56) References Cited

U.S. PATENT DOCUMENTS

| | | | |
|---|---|---|---|
| 8,377,243 | B2 | 2/2013 | Goelzhaeuser et al. |
| 8,518,612 | B2 | 8/2013 | Shoji et al. |
| 8,911,852 | B2 | 12/2014 | Gölzhäuser et al. |
| 2004/0091788 | A1 | 5/2004 | Powers |
| 2005/0042153 | A1* | 2/2005 | Bristol ............... B32B 5/18 422/186.3 |
| 2008/0123073 | A1 | 5/2008 | Shiraishi et al. |
| 2008/0152873 | A1* | 6/2008 | Okoroanyanwu ..... B82Y 10/00 428/195.1 |
| 2011/0229699 | A1 | 9/2011 | Golzhauser |
| 2012/0045714 | A1* | 2/2012 | Akiyama ............... G03F 1/24 430/5 |
| 2016/0147141 | A1* | 5/2016 | Ono ..................... G03F 1/24 430/5 |
| 2017/0090279 | A1* | 3/2017 | Ono ..................... G03F 1/64 |

FOREIGN PATENT DOCUMENTS

| | | |
|---|---|---|
| EP | 2113809 B1 | 6/2011 |
| EP | 2465012 B1 | 12/2012 |
| JP | 2014002642 A1 | 1/2014 |
| WO | 2010015508 A2 | 2/2010 |
| WO | 2013174656 | 11/2013 |
| WO | 2014142125 | 9/2014 |
| WO | 2014188710 | 11/2014 |
| WO | 2015045414 | 4/2015 |

OTHER PUBLICATIONS

Nottbohm, C. T.; Turchanin, A.; Beyer, A.; Stosch, R.; Goelzhaeuser, A.Mechanically Stacked 1-nm-Thick Carbon Nanosheets: Ultrathin Layered Materials with Tunable Optical, Chemical, and Electrical Properties Small 2011, 7, 874-883, DOI: 10.1002/smll.201001993.
Beyer A, Turchanin A, Nottbohm C T, Mellech N, Schnietz M, Gölzhäuser A., "Fabrication of metal patterns on freestanding graphenoid nanomembranes" J Vac Sci Technol, B. 2010;28:C6D5. doi: 10.1116/1.3511475.
C. Zoldesi et al., "Progress on EUV Pellicle development", Proc. SPIE, vol. 9048, 90481N (2014).
A. Turchanin and A. Gölzhäuser, "Carbon nanomembranes from self-assembled monolayers: Functional surfaces without bulk," Prog. Surf. Sci. 87, 108 (2012). https://doi.org/10.1016/j.progsurf.2012.05.001.
X. Zhang, A. Beyer, and A. Gölzhäuser, "Mechanical characterization of carbon nanomembranes from self-assembled monolayers,"Beilstein J. Nanotechnol. 2, 826 (2011). https://doi.org/10.3762/bjnano.2.92.
X. H. Zhang , C. Neumann , P. Angelova , A. Beyer , and A. Gölzhäuser, "Tailoring the Mechanics of Ultrathin Carbon Nanomembranes by Molecular Design," Langmuir 30, 8221 (2014). https://doi.org/10.1021/la501961d.
P. Zhang, et al., "Fracture toughness of graphene," Nat. Commun. 5, 3782 (2014) https://doi.org/10.1038/ncomms4782.
Angelova, P. et al. A universal scheme to convert aromatic molecular monolayers into functional carbon nanomembranes. ACS Nano 7, 6489-6497 (2013).

* cited by examiner

PELLICLE

FIELD OF THE INVENTION

The present invention relates to a pellicle for a lithographic device, a lithographic device incorporating the pellicle and a method for manufacturing the pellicle.

BACKGROUND OF THE INVENTION

A lithographic device enables a desired pattern to be projected onto a substrate or a target portion of the substrate and is used, for example, in the manufacture of integrated circuits (ICs) or solar cells. A patterning device, which is usually referred to as a mask or a reticle, is used to generate from the desired pattern a circuit pattern to be formed for an individual layer of the IC. Transfer of the circuit pattern is typically via imaging onto a layer of radiation-sensitive material (resist) that is provided on the substrate. In general, a single substrate will contain a network of adjacent target portions that are successively patterned.

Lithography has been widely used as one of the steps in the manufacture of ICs and other devices and/or structures. However, as the dimensions of features made using lithography become smaller, physical limitations in the use of lithography have become a limiting factor for enabling miniature IC or other devices and/or structures to be manufactured.

In order to shorten the exposure wavelength and, thus, reduce the minimum printable size, an extreme ultraviolet (EUV) radiation source has begun to replace other sources of radiation. EUV radiation is electromagnetic radiation having a wavelength within the range of 5-20 nm.

It is known in the art to product EUV radiation produced using a plasma (see, for example European Patent No EP 2 465 012 B1). A radiation system for producing EUV radiation may include a laser for exciting a fuel to provide the plasma, and a source collector module for containing the plasma. The plasma may be created, for example, by directing a laser beam at a fuel, such as particles of a suitable material (e.g. tin (Sn)), or a stream of a suitable gas or vapour, such as Xe gas or Li vapour. The resulting plasma emits EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source.

In an alternative arrangement, a radiation system for producing EUV radiation may use an electrical discharge to generate the plasma. The electrical discharge passes into a gas or vapour such as Xe gas, Li vapour or Sn vapour, generating a very hot plasma, which emits EUV radiation. Such a radiation system is typically termed a discharge produced plasma (DPP) source.

The plasma creation within the EUV source may cause contamination particles to be created from the fuel. These contamination particles may move either at relatively fast speeds, in which case they tend to generally follow the path of the radiation beam; or at relatively slow speeds, in which case they are free to undergo Brownian motion. In some lithographic device, the relatively slow moving contamination particles may be conveyed by a flow of gas within the lithographic device.

Both the relatively fast moving and relatively slow moving contamination particles may move towards the patterning device of the lithographic device. If the contamination particles reach the patterning device (even in very small numbers) then they may contaminate the patterning device. The contamination of the patterning device may reduce the imaging performance of the lithographic device and may in more serious cases require the patterning device to be replaced. The replacement of the patterning device is expensive and a time-consuming process, during which the operation of the lithographic device needs to be stopped.

Various solutions to the protection of the patterning device are known in the art. For example, international patent application number WO 2010/015508 A2 discloses a lithographic device that includes an optical element, which comprises an oriented carbon nanotube sheet. The sheet may be used as optical element and may be designed to reduce debris and/or improve the ratio of EUV/non-desired radiation. The sheet, due to its strength, does not necessarily need a support.

In European patent EP 2 113 809 B1 a silicon crystal film is used as a pellicle film. The film has a crystal plane as its principal plane, the plane being inclined at 3 to 5° from any lattice plane belonging to {100} planes or {111} planes. The silicon single crystal having such a crystal plane as its principal plane has effective bond density and Young's modulus thereof which are about 40% to about 50% higher than those of a silicon single crystal with <100> orientation and therefore a cleavage and crack do not easily occur. U.S. Pat. No. 6,623,893 B1 also teaches a silicon pellicle for use in EUV lithography and a method of making the pellicle. One of the issues associated with a pellicle made from silicon is that radiation is absorbed and the pellicle is warmed, which may thermally damage the film.

US patent application number 2008/0123073 discloses an optical element that includes a supporting structure, a multilayer film that is supported on the substrate and reflecting extreme ultraviolet light. The optical element also includes an alloy layer provided between the multilayer film and the substrate.

The afore-mentioned European patent number EP 2 465 012 B2 teaches a lithographic device having a membrane that is part of a chamber located between a radiation source and a patterning device. A membrane, made for example of graphene or a derivative thereof, is incorporated into a wall of the chamber and allows passage of the EUV radiation beam, but prevents contamination of the patterning device due to contamination particles. The graphene derivatives are graphane, graphene fluoride, graphene bromide, graphene chloride and graphene iodide.

Japanese Patent Application JP 2014 002642 also teaches a pellicle film that is made from an amorphous carbon film, diamond-like carbon film, graphite film and/or a silicon carbide film. The description states that the pellicle made from carbon is less susceptible to thermal damage compared to silicon pellicles.

International Patent Application No. WO 2014/142125 A1 (Asahi Materials Corp.) teaches a pellicle film used in a pellicle for extreme ultraviolet (EUV) lithography to protect a lithography mask from contamination. The pellicle film comprises a porous film with a carbon component, and has a thickness of 100 nm to 63 µm. The transmittance of the pellicle film during passage of an extreme-ultraviolet light with wavelength of 13.5 nm is 84% or more. The pellicle film of WO '125 has pore sizes of between 6.75 nm and 2430 nm.

The manufacturing methods disclosed in WO '125 teach the formation of the film by coating from a liquid and controlling the thickness and porosity of the coated layers. The coated layers are then sintered and carbonised.

A more recently published International Patent Application No. WO 2015/045414 A1 (Mitsui Chemicals Inc.) teaches a film, which is used in a pellicle. The film comprises a resin made from a polymer compound and has a thickness of between 10 nm and 100 nm. The polymer compound includes an aromatic polyimide and/or an aliphatic polyimide. The pellicle of this patent application is used in an exposure apparatus which has a light source for emitting light in the extreme ultraviolet (EUV) range, an optical system, and an exposure plate. The light from the light source is transmitted to the exposure plate through the optical system. The exposure plate is arranged such that the exposure light emitted from the light source is transmitted through the pellicle film of the exposure plate. The pellicle film of this application has a transmission of greater than 50% to EUV light at a wavelength of, for example, 13.5 nm, and has high durability under EUV irradiation.

Carbon nanomembranes similar to those used in this disclosure have been described in U.S. Pat. No. 6,764,758 B1 and EP 1 222 498 B1.

SUMMARY OF THE INVENTION

The carbon-based film of the present disclosure arises from radiation-induced cross-linking of molecular monolayers of low-molecular aromatic molecules, heteroaromatic molecules, or polyyne-based or polyene-based amphiphilic molecules. The carbon-based film from low-molecular aromatic molecular or heteroaromatic molecules is also termed a carbon nanomembrane (CNM) (see for example A. Turchanin, A. Golzhauser, Prog. Surf Sci. 2012, 87, 108). The carbon nanomembranes (CNMs) are two-dimensional carbon-based objects comprising at least one layer of densely packed cross-linked aromatic molecules or heteroaromatic molecules. The carbon nanomembranes are of molecular thickness and exhibit enhanced mechanical strength (X. Zhang et al., Beilstein J. Nanotech. 2011, 2, 826) and thermal and chemical stability.

For the purposes of the present disclosure, a "molecular monolayer" is understood to be a layer that only has the thickness of a molecule. This molecular monolayer is composed of low-molecular aromatic molecules, heteroaromatic molecules, or polyyne-based or polyene-based amphiphilic molecules.

The term "low-molecular molecules" means such compounds that are not in an oligomer or polymer form. Moreover, this term includes the possibility that the molecules are cross-linked with each other after a high-energy radiation treatment. The term "aromatics" includes the term "heteroaromatics" in this disclosure, i.e. the term "aromatics" means aromatic compounds that contain no heteroatoms or one or more heteroatoms in at least one aromatic ring. Preferably, the molecular monolayer is composed of aromatics selected from the group consisting of phenyl, biphenyl, terphenyl, quaterphenyl, naphthaline, anthracene, pyrene, bipyridine, terpyridine, thiophene, bithienyl, terthienyl, pyrrole, and combinations thereof.

The molecular monolayer is cross-linked in the lateral direction. By cross-linking in the lateral direction, high mechanical, chemical and thermal stability is imparted to the molecular monolayer that is composed of the low-molecular aromatic molecules, heteroarmoatic molecules, or polyyne-based or polyene-based amphiphilic molecules. Preferably, the molecular monolayer is cross-linked by a treatment with electron radiation, plasma radiation, X-ray radiation, β-radiation, γ-radiation, UV radiation or EUV radiation.

This disclosure teaches a pellicle for a lithographic device using a radiation beam. The pellicle comprises a carbon-based film having at least one layer of cross-linked molecules which is selected from the group consisting of aromatic molecules, heteroaromatic molecules, polyyne-based or polyene-based amphiphilic molecules. The carbon-based film has a periphery and a center portion. The center portion is transparent to the radiation beam. A support structure is coupled at least to the periphery of the carbon-based film. The carbon-based films in the pellicle protect a reticle from damage due to contamination particles, but still allow radiation to pass through.

The carbon-based film has a thickness of between 0.1 nm and 10 nm and is thus much thinner than the pellicle films known in the prior art. This means that the pellicle film made from the teachings of this disclosure is much more transparent to light.

In one aspect, the support structure further comprises a porous portion to which the carbon-based film is attached and provides more stability to the carbon-based film. The carbon-based film can have at least one functionalised surface. In a further aspect, at least one further film is attached to the carbon-based film. This further film is selected from the group consisting of a carbon-based film, an amorphous carbon film, a graphene layer, or a silicon film.

The pellicle can be used in a lithographic device comprising a radiation source for producing a radiation beam, a patterning support configured to support a patterning device for imparting the radiation beam with a pattern and a chamber located between the radiation source and the patterning support. One of a plurality of walls defining the chamber comprises at least partly the carbon-based film.

A method of manufacture of the pellicle is also disclosed and comprises: providing a substrate, adding carbon-containing compounds to a surface of the substrate, cross-linking of the carbon-containing compounds, thus forming the at least one carbon-based film. The at least one carbon-based film is removed from the substrate and a support structure provided onto which the at least one carbon-based film is applied at least about a periphery onto the support structure. The films are not sintered, unlike in the prior art

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
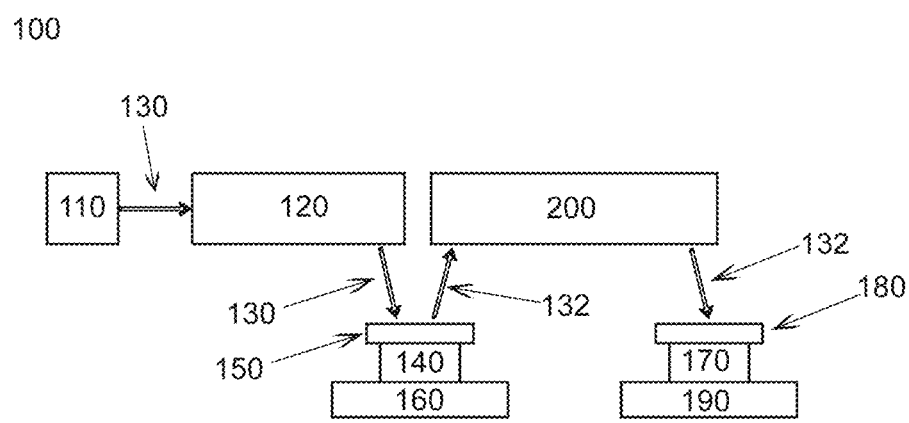
FIG. 1 depicts a lithographic device according to an embodiment of the invention.

FIG. 1 schematically depicts a lithographic device 100 including a source 110 according to one aspect of this disclosure. The lithographic device 100 comprises an illumination system 120 configured to condition a radiation beam 130 generated by the source 110. The radiation beam 130 is, for example, EUV radiation, but this is not limiting of the invention. The lithographic device 100 further includes a support structure (e.g. a mask table) 140, which is constructed to support a patterning device 150, such as a mask or a reticle. The support structure 140 is connected to a first positioner 160 that is configured to position the patterning device 150. A substrate table (e.g. a wafer table) 170 is constructed to hold a substrate 180, which is typically a resist-coated wafer, but this is not limiting of the invention. The substrate table 170 is connected to a second positioner 190 to position the substrate 180 with respect to the patterned radiation beam 132 and a projection system 200. The projection system 200 is configured to project a pattern imparted to the radiation beam 130 by the patterning device 150 in the form of the patterned radiation beam 132 onto a target portion (e.g. comprising one or more dies) of the substrate 180. This projected pattern would be typically a pattern of connections for an IC circuit.

The support structure 140 holds the patterning device 150 in a manner that depends on the orientation of the patterning device 150, the design of the lithographic device 100, and other conditions, such as for example whether or not the patterning device 150 is in a vacuum environment.

Referring to FIG. 1, the illumination system 120 receives an extreme ultraviolet (EUV) radiation beam 130 from the source 110. Methods to produce the EUV radiation include, but are not necessarily limited to, converting a fuel material (230 on FIG. 2) into a plasma state that has at least one element, e.g. xenon (Xe), lithium (Li), tin (Sn), gadolinium (Gd) or terbium (Tb) coupled with one or more emission lines in the EUV range. In one such method, often-termed laser produced plasma ("LPP") the required plasma can be produced by irradiating the fuel material with a laser beam. The fuel material may for example be in the form of a droplet, stream or cluster of material having the required line-emitting element. The source 110 may be part of an EUV radiation system including a laser, not shown in FIG. 1, for providing the laser beam, which excites the fuel material. The resulting plasma emits output EUV radiation, which is collected using a radiation collector located in the source 110.

The radiation beam 130 is incident on the patterning device 150. After being reflected from the patterning device 150, the patterned radiation beam 132 passes through the projection system 200, which focuses the patterned radiation beam 132 onto a target portion of the substrate 180. With the aid of the second positioner 190 and a position sensor, the substrate table 170 can be moved accurately, e.g. so as to position different target portions of the substrate 180 in the path of the patterned radiation beam 132. Similarly, the first positioner 160 and another position sensor can be used to position the patterning device 150 with respect to the path of the radiation beam 130. The patterning device 150 and the substrate 180 may be aligned using mask alignment marks and substrate alignment marks, as is known in the art.

Figure 2:
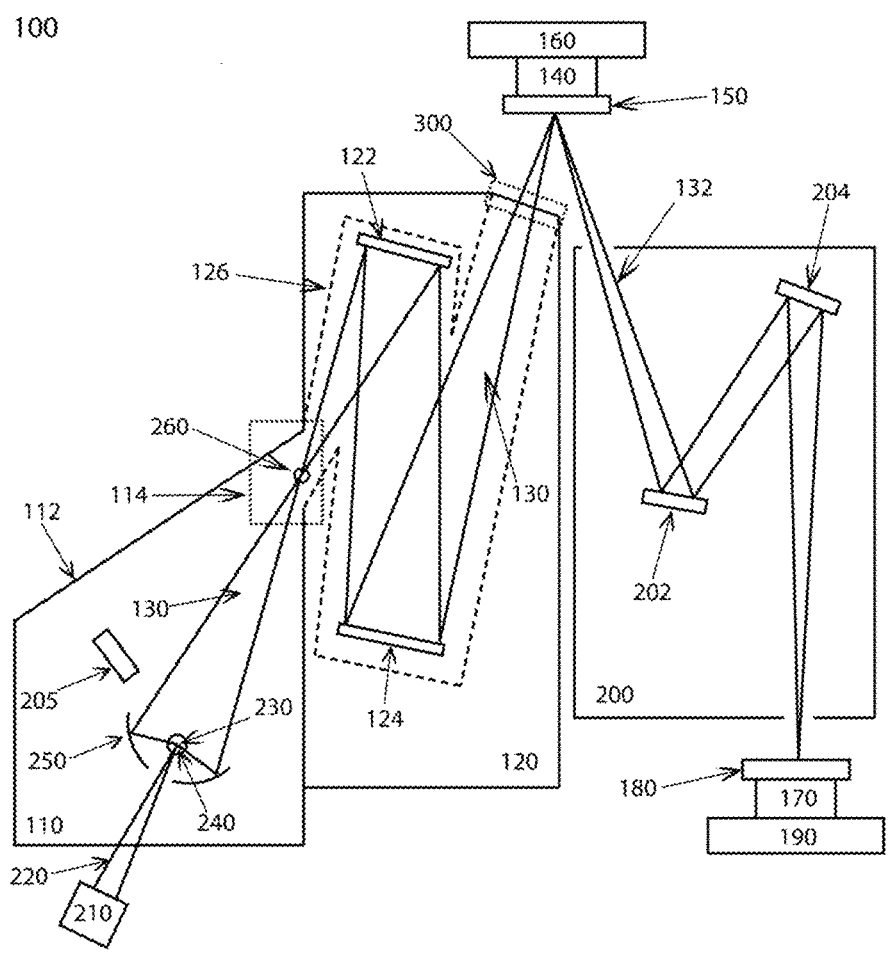
FIG. 2 is a more detailed schematic view of the lithographic device including a source, an illumination system and a projection system.

FIG. 2 shows the lithographic device 100 in more detail, including the source 110, the illumination system 120, and the projection system 200. The source 110 is constructed and arranged such that a vacuum environment can be maintained in an enclosing structure 112 of the source 110.

A laser 210 is arranged to deposit laser energy via a laser beam 220 into the fuel material 230, such as xenon (Xe), tin (Sn) or lithium (Li) which is provided from a fuel supply 205, thereby creating a highly ionized plasma 240 with electron temperatures of several 10's of eV. The energetic radiation generated during de-excitation and recombination of these ions is emitted from the plasma 240, collected and focussed by a near normal incidence collector optic 250.

Radiation that is reflected by the collector optic 250 is focused in a virtual source point 260. The virtual source point 260 is commonly referred to as the intermediate focus, and the source 110 is arranged such that the intermediate focus 260 is located at or near an opening 114 in the enclosing structure 112. The virtual source point 260 is an image of the radiation emitting plasma 240.

The source 110 shown in FIG. 2 comprises an LPP source, but may comprise any suitable source and may for example comprise a DPP source. The collector optic 250 is configured to collect the EUV radiation and focus the radiation to the intermediate focus 260.

After passing through the intermediate focus 260, the radiation beam 130 traverses the illumination system 120. The illumination system 120 may include a facetted field mirror device 122 and a facetted pupil mirror device 124 arranged to provide a desired angular distribution of the radiation beam 130 at the patterning device 150, as well as a desired uniformity of radiation intensity at the patterning device 150. Upon reflection of the radiation beam 130 at the patterning device 150, the patterned beam 132 is formed and the patterned beam 132 is imaged by the projection system 200 via reflective elements 202, 204 onto the substrate 180 held by the substrate table 170.

More elements than shown may generally be present in the illumination system 120 and projection system 200. Further, there may be more mirrors present than those shown in FIG. 2, for example there may be 1-6 additional reflective elements present in the projection system 200 than shown in FIG. 2.

The creation of ionized plasma from the fuel material 230 not only produces radiation, but also produces unwanted contamination particles. In the case in which tin (Sn) is used as fuel, these contamination particles have been reported to be produced at a rate of approximately 1000 per second. The contamination particles have in general a size of up to about 150 nanometers, and may in some circumstances have a size of up to about 500 nanometers. The contamination particles may have a speed of up to about 100 meters per second, and may have a speed of up to about 1000 meters per second. Further details are outlined in the afore-mentioned European Patent No. EP 2 465 012 B1.

The contamination particles produced with different speeds may take different paths from the plasma 240. For example, relatively fast ones of the contamination particles may travel in the same direction as the radiation beam 130 produced by the source 110. Furthermore, some relatively fast ones of the contamination particles may strike the collector optic 250 and bounce off the collector optic 250 such that the relatively fast contamination particles will also follow the path of the radiation beam 130. When the relatively fast moving contamination particles follow the path of the radiation beam 130, the contamination particles may bounce off the mirror devices 122, 124 within the illumination system 120 so that they reach the patterning device 150.

Relatively slow moving ones of the contamination particles may undergo Brownian motion and hence drift through the low-pressure environment of the source 110 and the illuminator module 120 towards the patterning device 150. Furthermore, in some embodiments of the lithographic device, such as that shown in FIG. 2, the illumination system 120 and/or the source 110 may comprise a gas flow conduit 126. The gas flow conduit 126 may have a gas pumped through it to reduce molecular contamination within the illumination module 120. The molecular contamination may be the accumulation of molecules (or products of the dissociation of these molecules caused by the radiation beam) on the surfaces of reflectors (or other optical components) within the lithographic device 100.

The molecules may originate from within the lithographic device 100 itself. For example, the molecules may originate from the components of the lithographic device 100, from lubricants used within the lithographic device 100 or from electronic systems within the lithographic device 100. The gas pumped through the gas conduit 126 may be atomic hydrogen. In some embodiments, the gas may be pumped into the gas conduit 126 so that the gas travels in a direction towards the patterning device 150. In this case, the movement of the gas through the gas conduit 126 may carry the relatively slow contamination particles with the gas towards the patterning device 150.

In the lithographic device 100, if the contamination particles reach the patterning device 150 (even in small numbers less than 1 particle per hour), then this may have a detrimental effect on the imaging performance of the lithographic device 100. If the patterning device 150 becomes contaminated with the contamination particles, it may be necessary to replace or clean the patterning device 150. In order to replace or clean the patterning device 150 it may be necessary to stop the operation of the lithographic device 100.

Figure 3:
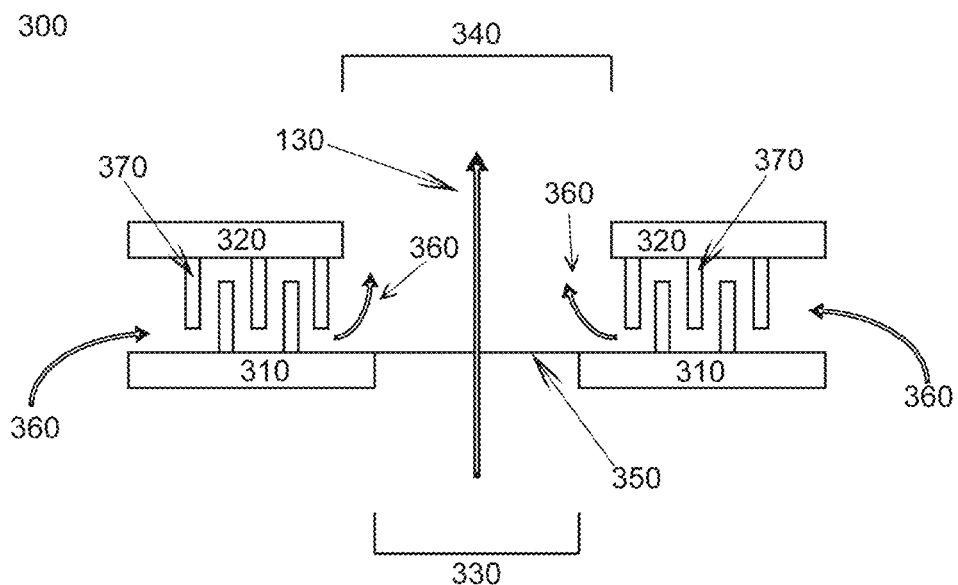
FIG. 3 is a view of a membrane and particle trapping structure according to an embodiment of the present invention.

FIG. 3 shows a schematic cross section through a portion of the lithographic device 100 indicated by 300 in FIG. 2. The portion of the lithographic device 100 shown in FIG. 3 is capable of preventing both the fast moving contamination and the slow moving contamination particles from reaching the patterning device 150. The portion of the lithographic device 100 shown in FIG. 3 comprises first wall 310 and second wall 320, which define part of the gas conduit 126 of FIG. 2. The first wall 310 and the second wall 320 have openings 330 and 340. The openings 330 and 340 have an axis, which is the optical axis of the radiation beam 130 of the lithographic device 100. The opening 330 in the first wall 310 comprises a gas-tight membrane 350, which is secured across the opening 330 to prevent the passage of gas from one side of the first wall 310 to the other side of the first wall 310 via the opening 330.

The first wall 310 and the second wall 320 are spaced from one another such that there is at least one gas flow path between them. In the aspect shown in FIG. 3 there are two gas flow paths 360, one either side of the optical axis. The gas flow paths 360 allow gas to flow from inside the gas conduit 126 to outside the gas conduit 126. The gas flow paths 360 are defined by particle trapping structures 370. The particle trapping structures 370 may prevent substantial numbers of the contamination particles from passing through the particle trapping structures 370.

In use, the openings 330 and 340 are arranged within the lithographic device 100 so that the radiation beam 130 passes through the openings 330 and 340, including passing through the membrane 350. The material and thickness of the membrane 350 is chosen so that the membrane 350 permits the radiation beam 130 to pass through the membrane 350. It will be appreciated that in some aspects of the invention the membrane 350 may not permit 100% of the incident radiation to pass through. The thickness and material of the membrane 350 is also chosen so that contamination particles travelling at fast speeds in the direction of the radiation beam 130 can strike the membrane 350 without causing degradation of the membrane 350 such that it enables passage of the contamination particles.

It can be seen that the combination of the membrane 350 formed from a material and thickness sufficient to prevent fast moving contamination particles passing through the membrane 350 (and also sufficient to prevent the membrane from degrading such that it enables passage of the contamination particles), and the particle trapping structure 370 configured to collect slow moving contamination particles will result in the lithographic device 100 capable of preventing both fast and slow moving contamination particles from reaching the patterning device 150.

The membrane 350 is constructed from a carbon-based film, which in one aspect comprises a carbon nanomembrane of a cross-linked molecular monolayer of aromatic molecules or heteroaromatic molecules. In another aspect, the carbon-based film may be of polyyne-based or polyene-based amphiphilic molecules. The carbon-based film is impermeable to both the fast moving contamination particles and slow moving contamination particles. The membrane material allows the radiation beam 130 of the lithographic device 100 to pass through the membrane 350 from the source 110 to the patterning device 150.

Within the lithographic device 100 of FIGS. 2 and 3, the membrane 350 is depicted adjacent two separate particle-trapping structures 370. It will be appreciated that a lithographic device 100 according to the present invention may comprise only one particle trapping structure 370 or alternatively may comprise more than two particle-trapping structures 370. Furthermore, any particle trapping structure 370 may be located at a position remote to the membrane 350.

In the aspect shown in FIG. 2, the membrane 350 and the particle trapping structure 370 are located within the illumination system 120 at the end of the gas conduit 126 closest to the patterning device 150. This need not be the case. For example, the membrane 350 and the particle trapping structure 370 may be positioned at the end of the gas conduit 126, which is closest to the intermediate focus 260. Additionally or alternatively, the membrane 350 and the particle trapping structure 370 may be located within the source 110, for example at a position between the collector optic 250 and the intermediate focus 260.

In a further alternative embodiment, the membrane 350 may be such that the membrane 350 forms both part of the illumination system 120 (the membrane 350 being intermediate optics within the illumination system 120 and the patterning device 150) and part of the projection system 200 (the membrane 350 also being intermediate optics within the projection system 200 and the patterning device 150). In this aspect, the membrane 350 separates the patterning device 150 from both the illumination system 120 and the projection system 200.

The membrane 350 may define, in part, a chamber within which the patterning device 150 is situated. It will be appreciated that in this aspect of the disclosure, the radiation beam 130 will pass through the membrane 350 twice: once when the radiation beam 130 travels from the illumination system 120 to the patterning device 150 and once when the patterned radiation beam 132 travels from the patterning device 150 to the projection system 200. The illumination system 120 and projection system 200 may each comprise a chamber, which is defined in part by the membrane 350. The membrane 350 may be provided after the source 110 and before the optics of the illumination system 120.

It will also be appreciated that a lithographic device according the present invention may comprise more than one membrane 350.

Figure 4:
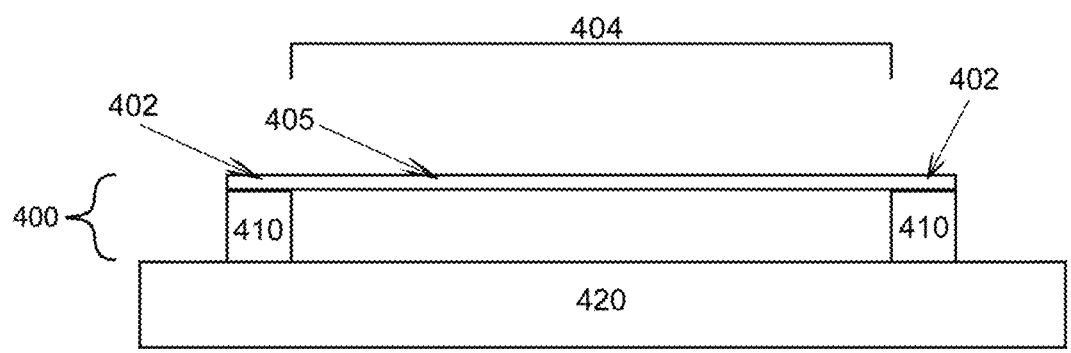
FIG. 4 is a cross sectional view through a reticle with a pellicle which may form part of a lithographic device according to the invention.

FIG. 4 shows a carbon-based film 405 forming a pellicle 400 with a reticle 420. The carbon-based film 405 is supported at its periphery 402 by a pellicle frame 410, which holds the carbon-based film 405 at a fixed distance from the reticle 420. The reticle 420 lies in the focal plane of the lithographic device 100 and is an example of a patterning device 150. The radiation beam 130 can pass through a center portion 404 of the carbon-based film 405.

The use of the pellicle 400 is a way of preventing debris (e.g. contamination particles or dust particles) from coming into contact with the reticle 420. Any debris, which comes to rest on the reticle 420, may cause substantial degradation in the imaging performance of the lithographic device because the reticle 420 (and hence the debris in contact with the reticle) is in the focal plane of the lithographic device 100. As previously stated, the pellicle 400 prevents debris from reaching the reticle 420. Any debris, which comes to rest on the pellicle 400, will not be in the focal plane of the lithographic device 100 and therefore any degradation in the imaging performance of the lithographic device 100 will be much less than if the debris had come to rest on the reticle 420.

The properties of the carbon-based film 405 are known to fulfil several requirements if they are to be used in EUV lithography (Table 1 from Zoldesi et al., Proc. of SPIE 2014, 9048, 90481-N1).

TABLE 1

Preliminary EUV pellicle guidelines and requirements for high volume manufacturing

| | Item | Requirements and guidelines |
|---|---|---|
| Pellicle material requirements | Pellicle film EUV transmission | 90% single pass (81% double pass) |
| | EUV transmission spatial non-uniformity | <0.2% |
| | EUV transmission angular non-uniformity | <300 mrad max local pellicle angle |

TABLE 1-continued

Preliminary EUV pellicle guidelines and requirements for high volume manufacturing

| | Item | Requirements and guidelines |
|---|---|---|
| | EUV intensity in scanning slit at pellicle position | 5 W/cm$^2$ (250 W EUV source equivalent) |
| | Lifetime | ~315 hrs. (production hours in a EUV + H$_2$ environment) |
| Pellicle + frame requirements | Standoff distance | 2 ± 0.5 mm |
| | Max. acceleration | 100 m/s$^2$ |
| | Max. ambient pressure rate of change | <3.5 mbar/s (peak during pump-down in the load lock) |
| | Reticle reserved area for pellicle assembly (centered on substrate) | 110.7 mm × 144.1 mm: inner 118.0 mm × 150.7 mm: outer |

Pellicle impact on imaging performance: <0.1 nm CDU impact on wafer

Depending on the molecules used, the carbon nanomembrane for use in the pellicle 400 can have any suitable thickness. In one aspect, the carbon nanomembrane has a layer thickness in the range from 0.1 nm to 10 nm. In another aspect, the carbon nanomembrane has a layer thickness from 0.3 nm to 3 nm, and in a further aspect in the range from 0.5 to 2 nm. More details of the thickness measurements and the control of thickness by the choice of molecules are given in Angelova et al "A universal scheme to convert aromatic molecular monolayers into functional carbon nanomembranes", ACS Nano, vol 7, No 8, 6489-6497, 2013.

The carbon nanomembranes have high transmission of visible, ultraviolet and extreme ultraviolet light, as noted above. The transmission is comparable to the transmission of graphene and depends on the molecules used for preparation of the carbon nanomembrane.

It has been found that the carbon nanomembranes have transmission of EUV radiation at $\lambda=13.5$ nm of up to 98% and it is thought that it may be possible to extend the wavelength range to e.g. $\lambda=5 \ldots 20$ nm.

Figure 5:
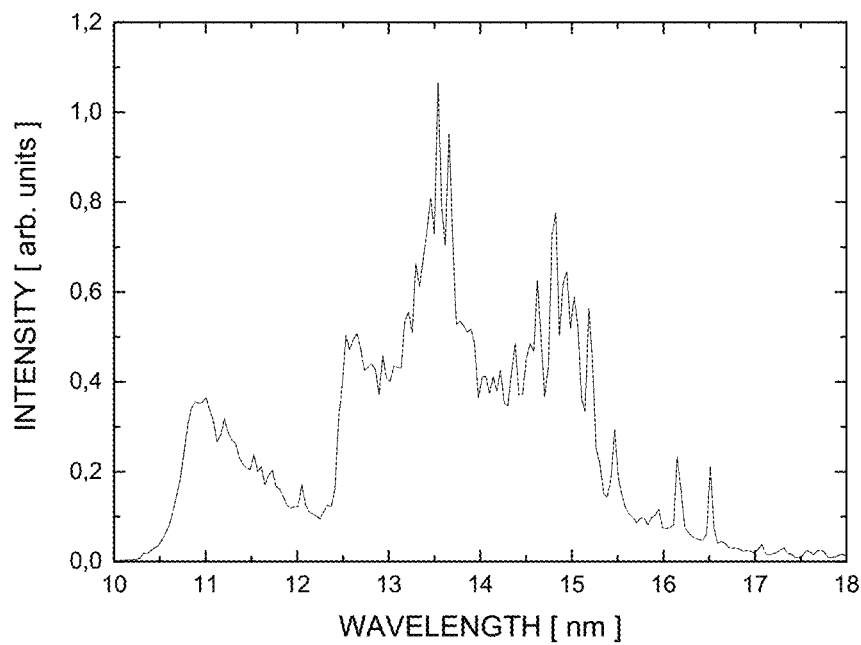
FIG. 5 depicts an emission spectrum of the source used for measuring the EUV transmission of carbon nanomembranes at the sample position.

The transmission of the EUV radiation was determined using a setup with a Xenonbased discharge based hollow cathode triggered (HCT) source operated in self-ignition mode with constant charging current. The carbon nanomembranes supported by a wire mesh were irradiated with a fluence of 3.2 nJ/cm$^2$. The emission spectrum at sample position (after Xenon self-absorption and spectral filtering through a zirconium coated silicon nitride window) is given in FIG. 5.

Figure 6:
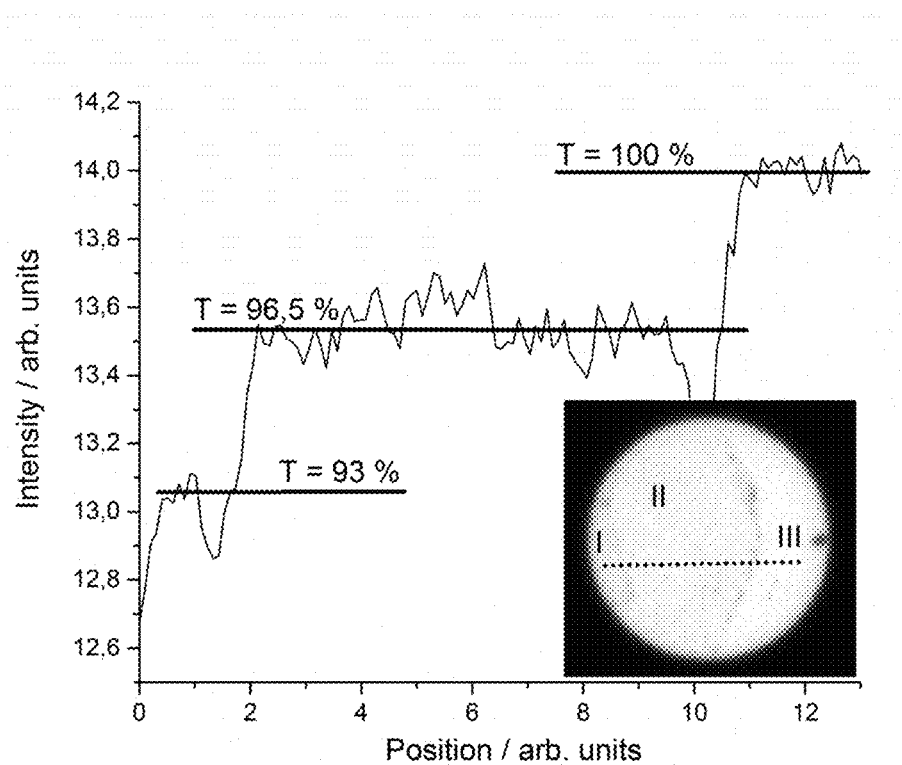
FIG. 6 depicts the transmitted EUV radiation through the carbon nanomembrane supported by a 1000 mesh copper grid.

The transmitted radiation was detected with a CCD camera directly after the sample. FIG. 6 shows in the lower right inset the CCD image of the transmitted radiation through the carbon nanomembrane supported by a 1000 mesh copper grid. There are three regions on the sample: on the left side (I) the mesh is covered with a double layer of the carbon nanomembrane, whereas the main part (II) of the mesh is covered with a single layer of the carbon nanomembrane, and on the right side (III) is only the mesh. A line profile of the intensity of the transmitted radiation along the marked line is given in the plot of FIG. 6.

Figure 7:
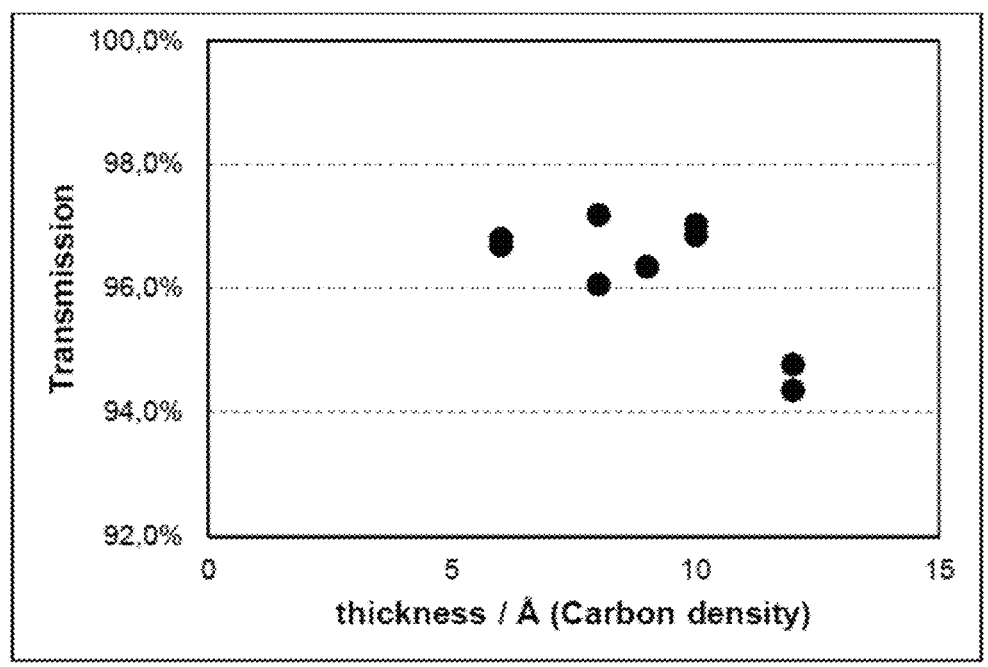
FIG. 7 depicts the transmission of EUV radiation in dependence on the thickness of different carbon nanomembranes prepared from different molecules.

A more accurate determination of the transmission was performed using regions of interest (averaging over larger regions of the CCD image of the transmitted radiation). The EUV transmission of five different types of carbon nanomembranes (prepared from 1-mercaptopyrene, naphthalenethiol, biphenylthiol, nitrobiphenylthiol and terphenylthiol) is given in FIG. 7. The transmission depends on the carbon density of the carbon nanomembrane, here measured in the thickness of a carbon layer, which was determined by the attenuation of the substrate signal in XPS-measurements. The thinnest membranes have a transmission at λ=13.5 nm of up to 98%.

The carbon nanomembranes have, due to their manufacture, a homogeneous thickness of 1 molecular monolayer over the whole area. Thus, a homogeneous transmission of radiation is ensured over the complete area.

It has been found that the carbon nanomembrane withstand EUV irradiation with a power density of more than 3 W/cm$^2$ at a partial hydrogen pressure of 3 Pa.

Figure 8:
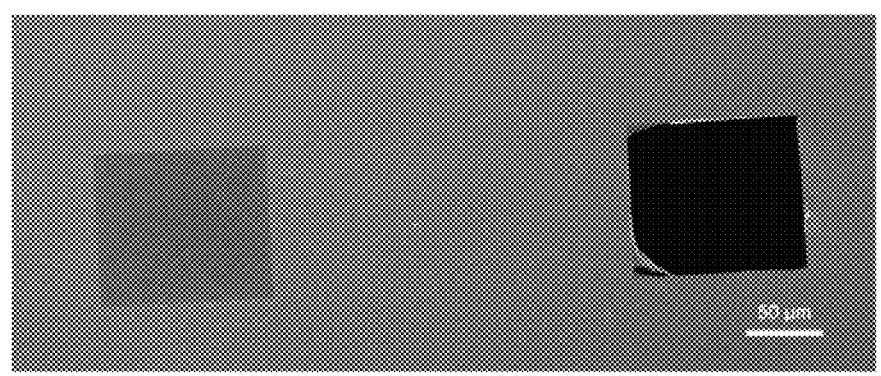
FIG. 8 shows a helium ion micrograph of an EUV irradiated freestanding carbon nanomembrane support by a silicon frame.

Freestanding ones of the carbon nanomembranes supported by a Si-frame were irradiated with broadband EUV-radiation at the PTB-laboratory at BESSY II in Berlin. The power density was at 3 W/cm$^2$. The chamber was filled with hydrogen at a partial pressure of 3 Pa. FIG. 8 shows a helium ion micrograph of a free-standing carbon nanomembrane (left side) prepared from terphenylthiol after irradiation with a total dose of approximately 10 kJ/cm$^2$. For imaging purposes, a window not covered by a film is shown on the right side of FIG. 8.

The carbon nanomembranes are an elastic but mechanical stable material and it is possible to suspend the carbon nanomembranes freestanding over large areas.

Many mechanical properties including Young's modulus, residual stress, tensile strength, and rupture pressure can be controlled by the choice of the molecule, the substrate the carbon nanomembrane is prepared on, and the manufacturing conditions.

Figure 9:
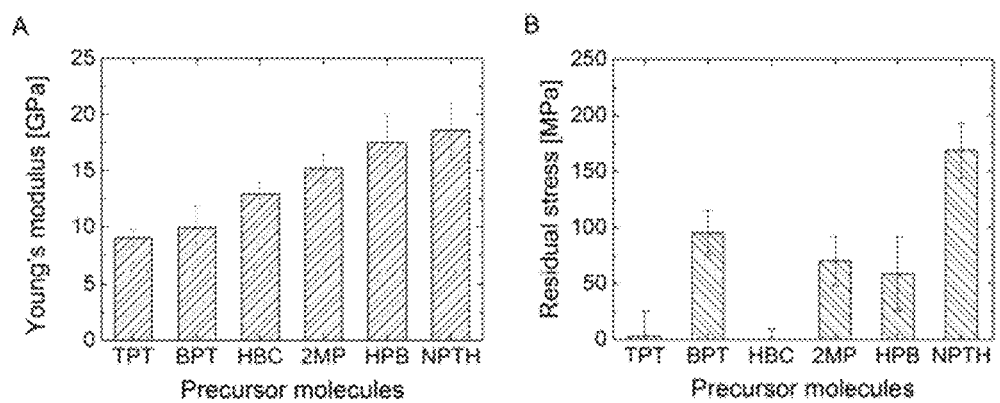
FIG. 9 shows a plot of the Young's modulus of the carbon nanomembranes prepared by different molecules (FIG. 9A) and the residual stress of the carbon nanomembranes prepared from different molecules (FIG. 9B).

AFM bulge tests were used to determine the Young's modulus and the residual stress of the freestanding carbon nanomembranes prepared from different molecules [X. Zhang et al., Langmuir 2014, 30, 8221]. The freestanding membrane over an opening of approximately 40×40 μm$^2$ was loaded with gas pressure, which gradually increases up to a certain level and then unloaded by decreasing the gas pressure gradually. The Young's modulus and the residual stress were extracted from the measured pressure-deflection relationship for a number of the carbon nanomembranes prepared from different molecules: terphenylthiol (TPT), biphenylthiol (BPT), a hexabenzocorenene derivative (HBC), mercaptopyrene (2MP), a hexaphenylbenzene derivative (HPB), and naphthalenethiol (NPHT). The measured values are given in FIG. 9.

By adjusting the residual stress of the membrane made from the carbon nanomembrane the flatness of the freestanding membrane can be ensured, which is necessary for minimizing imaging distortion by the pellicle.

The mechanical stability of the freestanding carbon nanomembranes was tested by rupture tests. [X. Zhang et al., Beilstein J. Nanotech. 2011, 2, 826] The rupture pressure allows determination of the ultimate tensile strength.

The ultimate tensile strength of the carbon nanomembranes prepared from nitrobiphenylthiol ranges from 440 to 720 MPa with a peak at approximately 570 MPa, The ultimate tensile strength of the carbon nanomembranes prepared from biphenylthiol ranges around 475 MPa.

Figure 10:
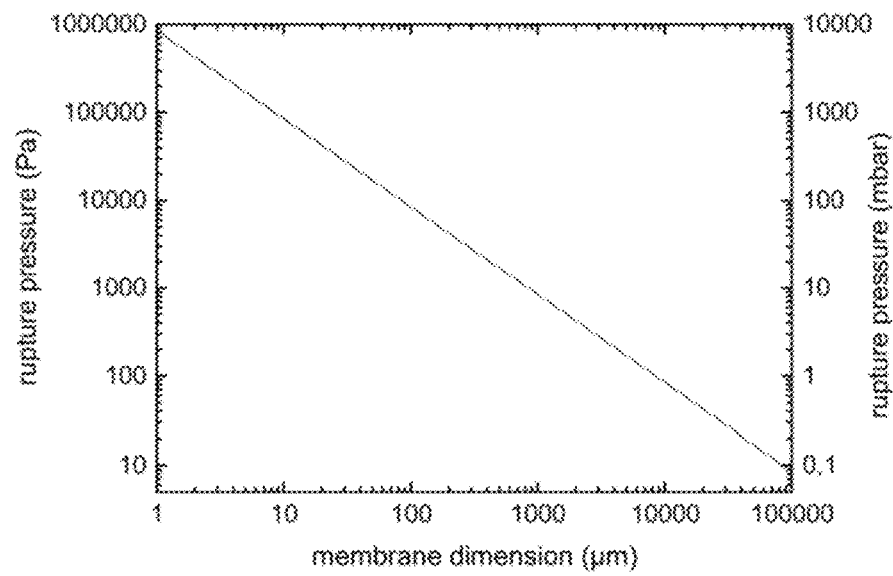
FIG. 10 shows the calculated rupture pressure of a square-shaped carbon nanomembrane as a function of membrane size.

Thus, the freestanding carbon nanomembranes with dimensions of a full pellicle (110.7×144.1 mm$^2$) will sustain pressure differences as high as several Pascals as apparent from FIG. 10, which shows the calculated rupture pressure (using the measured ultimate tensile strength) of a square-shaped carbon nanomembrane prepared from nitrobiphenyl-thiol as function of the membrane size.

The carbon nanomembrane withstands temperatures of more than 1000 K. Monomolecular films of the carbon nanomembranes can withstand extremely high temperatures without decomposition and maintain their form as a membrane.

The carbon nanomembrane withstands corrosion caused by many chemicals.

The carbon nanomembrane withstands immersion into acids, especially hydrofluoric acid and sulphuric acid.

The carbon nanomembrane withstands immersion into bases, especially potassium hydroxide.

The carbon nanomembrane withstands immersion into organic solvents, especially methanol, ethanol, isopropanol, acetone, toluene, dimethylformamide, dichloroethane, ethyl acetate, and tetrahydrofuran.

The surfaces of the carbon nanomembrane can be chemically functionalised. By functionalisation, it is possible to change many properties of the carbon-based layer. In one aspect of this disclosure, it is possible to change the resistance against corrosion, e.g. caused by hydrogen or hydrogen plasma.

In a further aspect of the disclosure, the carbon nanomembrane comprises two surfaces and at least one surface is terminated with at least one functional group. The at least one functional group may be selected from the group consisting of halogen atoms and carboxy, trifluoromethyl, amino, nitro, cyano, thiol, hydroxy, carbonyl groups or combinations thereof.

In one aspect of the disclosure, the at least one surface of the carbon nanomembrane, which is terminated with at least one functional group, is further functionalised.

The pellicle 400 can be made as a multilayer film in which at least one further film can be attached to (stacked onto) the carbon-based film 405.

In one exemplary embodiment of the invention, the at least one further film is selected from the group consisting of a carbon-based film, an amorphous carbon film, a graphene layer or a silicon film.

By attaching a further film to the carbon-based film, the multilayer film is provided with properties different from those of the further film and the carbon-based film by themselves:

The carbon-based film can protect the further film from damage caused by chemical reaction, for example from damage caused by corrosion and oxidation, and from damage caused by hydrogen and hydrogen plasma.

The carbon-based film can change the mechanical properties of the further film (and vice versa). This means, for example, that the tensile strength and thus the rupture pressure of the multilayer film are improved compared to the further film or the carbon-based film. Thus, it is possible to suspend the multilayer film over even larger open areas than it is possible with the further film alone or the carbon-based film alone.

Perfect graphene is believed to be the strongest material available with an intrinsic tensile strength of 130 GPa and a Young's modulus of 1 TPa. However, the useful strength of technical graphene is limited due to defects. [P. Zhang et al., Nature Communications 2014, 5, 3782] Technical graphene is composed of many domains with grain boundaries in between or is a composite of small graphene flakes. Therefore, technical graphene is likely to crack in a brittle manner like ceramic materials, as opposed to many metallic or polymeric materials. Technical graphene breaks with sharp edges, at a breaking stress substantially lower than the intrinsic strength of graphene. Thus, it is not easy to span large open areas as necessary for the use as pellicle. In contrast, the carbon-based film of this disclosure behaves more like a polymer film and is less brittle.

Perfect graphene is an atomically thin material with basically unlimited lateral dimension. However, technical graphene, for example graphene prepared by chemical vapour deposition, has areas with multiple layers besides areas with monolayers or is a composite of small graphene flakes. Thus, technical graphene is no single layer graphene with high transmission of EUV-radiation of more than 97%, but rather thicker layer with corresponding lower transmission. Moreover, a uniform thickness and thus a uniform transmission are not always guaranteed. The uniform thickness is also a challenge for the pellicles made of other materials like silicon. In contrast, the carbon-based film of this disclosure has due to its manufacture a homogeneous thickness of 1 molecular monolayer over the whole area. Thus, a homogeneous transmission of radiation is ensured over the complete area.

Pellicles made from polysilicon membranes have usually a capping layer made from a different material, e.g. silicon nitride. This capping layer contributes to the EUV transmission loss, as it is known in literature that the material (e.g. silicon nitride) has a higher EUV absorption coefficient compared with polysilicon layer. Due to their chemical resistance, the carbon nanomembranes of this disclosure has the ability to function as a capping layer.

The manufacture of the carbon-based film comprises the following steps:
providing a substrate;
adding carbon-containing compounds to a surface of the substrate;
cross-linking of the carbon-containing compounds, thus forming the at least one carbon-based film, having at least one layer of cross-linked aromatic molecules, heteroaromatic molecules, or polyyne-based or polyene-based amphiphilic molecules, on the surface of the substrate;
removing the at least one carbon-based film from the substrate;
providing a support structure; and
applying the at least one carbon-based film at least about a periphery onto the support structure.

The substrate used may be selected from the group consisting of gold, silver, titanium, zirconium, vanadium, chromium, manganese, cobalt, tungsten, molybdenum, ruthenium, platinum, aluminium, iron, steel, copper, nickel, silicon, germanium, indium phosphide, gallium arsenide and oxides, nitrides or alloys or mixtures thereof, indium-tin oxide, sapphire, silicate or borate glasses, and water. In one aspect of the present invention, the substrate is a silicon nitride layer on a silicon wafer.

The carbon-containing compounds may be selected from the group consisting of low molecular aromatic molecules. In one aspect of the manufacture, the low molecular aromatic molecules are selected from the group consisting of phenyl, biphenyl, terphenyl, quaterphenyl, naphthaline, anthracene, pyrene, bipyridine, terpyridine, thiophene, bithienyl, terthienyl, pyrrole, and combinations thereof.

The aromatic molecules, heteroaromatic molecules, or polyyne- or polyene-based amphiphilic molecules are then cross-linked in the lateral direction. Preferably, the monolayer is cross-linked by a treatment with electron radiation, plasma radiation, X-ray radiation, β-radiation, γ-radiation, UV radiation or EUV radiation.

In one aspect of the disclosure, the cross-linking comprises electron-induced cross-linking. The electron-induced cross-linking may be performed at an energy of 10 to 3000 eV, and in one aspect from 20 to 300 eV, and at a charge density of at least 10 mC/cm$^2$, and in one aspect 20 to 100 mC/cm$^2$.

Figure 11:
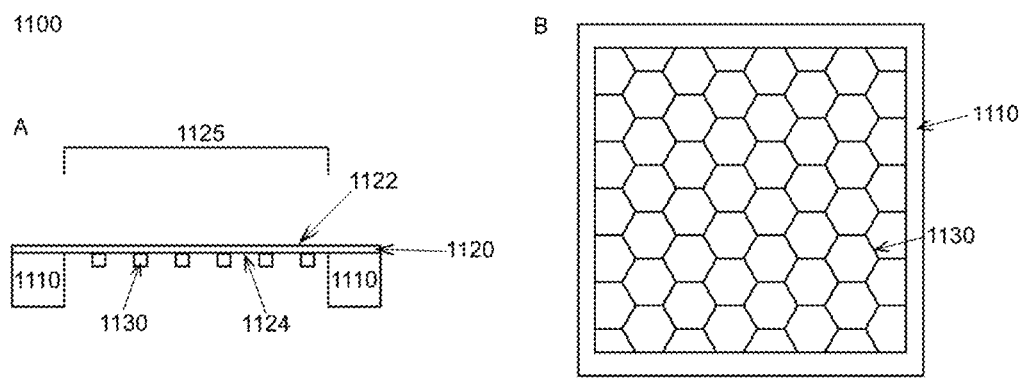
FIG. 11 shows an example of a pellicle in a cross-sectional view (FIG. 11A) and a planar view (FIG. 11B).

The pellicle 1100 has a support structure including an outer frame portion 1110 holding the carbon-based film 1120 and a porous portion (mesh structure) 1130 that occupies an inner area 1125 surrounded by the outer frame portion 1110, as shown in FIGS. 11A and 11B. The upper surface 1122 or the lower surface 1124 can be functionalised, as noted above.

Figure 12:
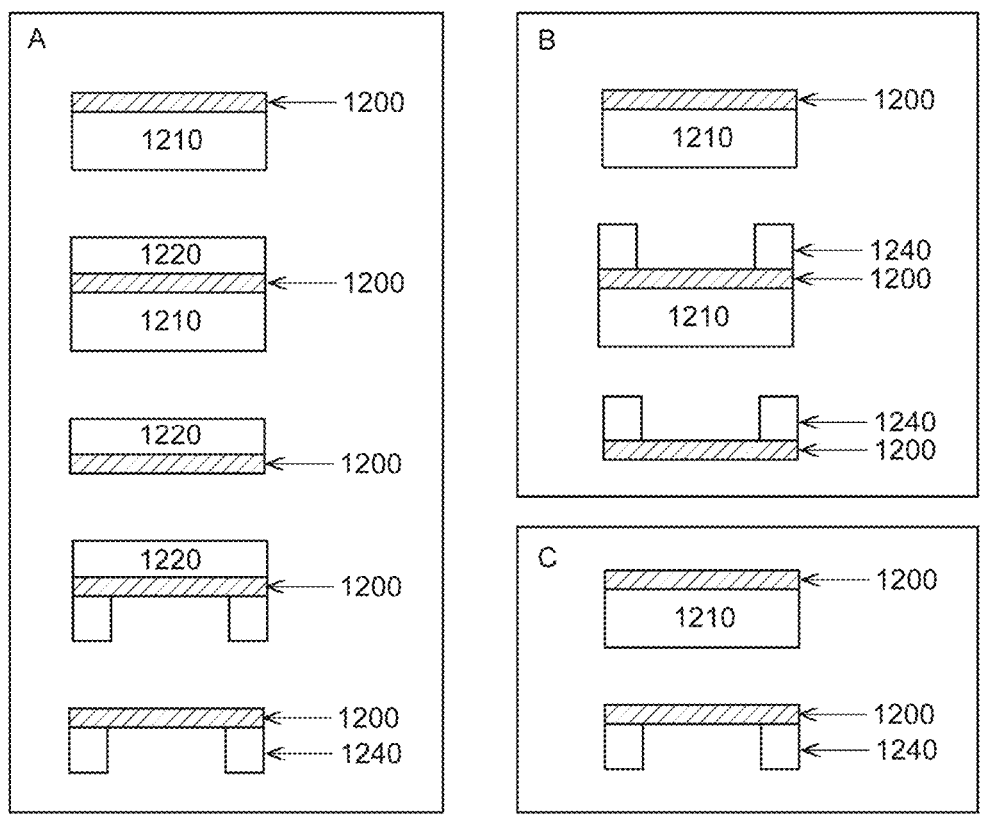
FIGS. 12A, 12B and 12C illustrate three different manufacturing methods.

In one aspect of the manufacture (FIG. 12A), a sacrificial layer 1220 may also be added on top of the carbon-based film 1200 and the substrate 1210 on which the carbon-based film 1200 has been manufactured. The sacrificial layer 1220 and the carbon-based film 1200 are then removed from the substrate 1210 together. The sacrificial layer 1220 protects the carbon-based film 1200 from any defects, which might occur during transfer of the carbon-based film 1200. The sacrificial layer 1220 also stabilizes the carbon-based film 1200. In this aspect, the substrate 1210 only serves as an auxiliary means. The substrate 1210 can be discarded or re-used after the carbon-based film 1200 is removed from the substrate 1210. The carbon-based film 1200 and the sacrificial layer 1220 are applied to a support structure 1240 and the sacrificial layer 1220 is subsequently removed. A detailed description can be found in U.S. Pat. No. 8,377,243 B2. The disclosure of this patent is incorporated herein by reference.

In a further aspect of the invention (FIG. 12B), the support structure 1240 may be added on top of the carbon-based film 1200. The support structure 1240 and the carbon-based film 1200 are then removed from the substrate 1210 together. In this aspect, the substrate 1210 only serves as an auxiliary means. The substrate 1210 can be discarded or re-used after the carbon-based film 1200 is removed from the substrate 1210.

In a further aspect of the invention (FIG. 12C), the removal of the carbon-based film 1200 from the substrate 1210 comprises the removing of a part of the substrate layer 1210 such that a remaining part of the substrate comprises the support structure 1240.

Manufacture of the Carbon Nanomembrane for the Pellicle 400

Example 1 (Based on A. Beyer et al., J. Vac. Sci. Technol. 2010, 28, C6D5)

A freestanding carbon nanomembrane supported by a copper mesh was prepared according to the following procedure: For the preparation of a 1,1'-biphenyl-4-thiol (BPT) self-assembled monolayer, 300 nm thermally evaporated gold on a mica substrates was used. The substrate was then immersed in a 1 mM solution of BPT in dry, degassed N,N-dimethylformamide at room temperature. Afterward, the sample was rinsed with DMF and ethanol and dried.

Cross-linking by electron irradiation was achieved under high vacuum with an electron floodgun at an electron energy of 100 eV and a dose of 50 mC/cm$^2$. Transfer of the carbon nanomembrane was performed by releasing the carbon nanomembrane from the gold/mica substrate using a polymeric transfer medium, for example, a layer of polymethyl methacrylate (PMMA) for stabilisation. First, the PMMA layer was deposited onto the carbon nanomembrane. Then, the gold/carbon nanomembrane/PMMA hybrid layer was separated from the mica substrate. The gold/carbon nanomembrane/PMMA hybrid layer was then floated onto a potassium iodide/iodine solution (0.6 M KI, 0.09 M I$_2$) to dissolve the gold. The remaining carbon nanomembrane/PMMA hybrid layer was then floated on water, from where the remaining carbon nanomembrane/PMMA hybrid layer was placed onto the copper mesh. Finally the PMMA sacrificial layer was removed by acetone leaving a freestanding carbon nanomembrane supported by the copper mesh support structure.

Example 2 (based on A. Beyer et al., J. Vac. Sci. Technol. 2010, 28, C6D5)

A freestanding carbon nanomembrane supported by a gold mesh support structure was prepared according to the following procedure: A thin silicon nitride substrate was immersed in a 10 mM solution of 4'-[(3-trimethoxysilyl)propoxy]-[1,1'-biphenyl]-4-carbonitril (CBPS) in dry toluene at room temperature, where a self-assembled monolayer of CPBS formed on the silicon nitride layer. Afterward, the sample was rinsed with ethyl acetate and ethanol and dried. Cross-linking by electron irradiation was achieved under high vacuum with an electron floodgun at an electron energy of 100 eV and a dose of 50 mC/cm$^2$. A resist layer was added onto the carbon nanomembrane and structured by electron beam or photolithography. Gold was then deposited and the resist was then removed by lift-off. Finally, the silicon nitride substrate was dissolved in hydrofluoric acid and rinsed in water as well as methanol, respectively, to yield a free-standing carbon nanomembrane with the gold support structure.

Example 3 (based on A. Beyer et al., J. Vac. Sci. Technol. 2010, 28, C6D5)

A freestanding carbon nanomembrane supported by a silicon support structure was prepared according to the following procedure: a window-structured silicon wafer, which was covered on one side by a 30 nm thick, low-stress silicon nitride layer, was used as substrate. The substrate was immersed in a 10 mM solution of 4'-[(3-trimethoxysilyl)propoxy]-[1,1'-biphenyl]-4-carbonitril (CBPS) in dry toluene at room temperature, where a self-assembled monolayer of CPBS formed on the silicon nitride layer. Afterward, the sample was rinsed with ethyl acetate and ethanol and dried. Cross-linking by electron irradiation was achieved under high vacuum with an electron floodgun at an electron energy of 100 eV and a dose of 50 mC/cm$^2$. The silicon nitride membrane was then dissolved in hydrofluoric acid, yielding a 1 nm thin, freestanding carbon nanomembrane, which was spanned over the windows of the silicon support structure.

Example 4

A pellicle comprising a thin silicon film is prepared according to methods known in the art, e.g. as described in U.S. Pat. No. 6,623,893 B1 or EP 2 113 809 B1. Then a carbon nanomembrane is formed on the surface of the silicon film by the following procedure: The passivated silicon surface is exposed to [1",4',1',1]-terphenyl-4-ol (TPol) by chemical vapour deposition. The TPol forms a self-assembled monolayer on the surface of the silicon film. Cross-linking by electron irradiation is achieved under high vacuum with an electron floodgun at an electron energy of 100 eV and a dose of 50 mC/cm$^2$. The formed carbon nanomembrane on the silicon surface protects the said surface from corrosion.

Example 5

A freestanding carbon nanomembrane supported by a silicon support structure is prepared according to the following procedure: A thin silicon film supported by a porous support structure is prepared according to methods known in the art, e.g. as described in U.S. Pat. No. 8,518,612 B2. Then a carbon nanomembrane is formed on the surface of the silicon film by the following procedure: The passivated silicon surface is exposed to [1",4',1',1]-terphenyl-4-ol (TPol) by chemical vapour deposition. The TPol forms a self-assembled monolayer on the surface of the silicon film. Cross-linking by electron irradiation is achieved under high vacuum with an electron floodgun at an electron energy of 100 eV and a dose of 50 mC/cm$^2$. Finally the silicon film not supported by the support structure is removed by dry etching or by etching in a potassium iodide solution.

LITERATURE

A. Turchanin, A. Golzhauser, Prog. Surf. Sci. 2012, 87, 108
X. Zhang et al., Beilstein J. Nanotech. 2011, 2, 826
C. Zoldesi et al., Proc. of SPIE 2014, 9048, 90481-N1
X. Zhang et al., Langmuir 2014, 30, 8221
P. Zhang et al., Nature Communications 2014, 5, 3782
A. Beyer et al., J. Vac. Sci. Technol. 2010, 28, C6D5
Angelova et al "A universal scheme to convert aromatic molecular monolayers into functional carbon nanomembranes", ACS Nano, vol 7, No 8, 6489-6497, 2013.

REFERENCE NUMERALS

100 Lithographic device
110 Source
112 Enclosing structure
114 Opening
120 Illumination system
122 Field mirror device
124 Pupil mirror device
126 Conduit
130 Radiation beam
132 Patterned radiation beam
140 Support structure
150 Patterning device
160 First positioner
170 Substrate table
180 Substrate
190 Second positioner
200 Projection system
202 Reflective element
204 Reflective element
205 Fuel supply
210 Laser
220 Laser beam
230 Fuel material
240 Plasma
250 Collector optic
260 Virtual source point
300 Cross section
310 First wall
320 Second wall
330 Opening
340 Opening
350 Membrane
360 Gas flow path
370 Particle trapping structures
400 Pellicle
402 Periphery
404 Center portion
405 Carbon-based film
410 Pellicle frame 420 Reticle
1100 Pellicle
1110 Outer frame
1120 Carbon-based film
1122 Upper surface
1124 Lower surface
1125 Inner area
1130 Porous portion
1200 Carbon-based film
1210 Substrate
1220 Sacrificial layer
1240 Support structure

The invention claimed is:

1. A pellicle for a lithographic device using a radiation beam, the pellicle comprising a carbon-based film and a support structure, wherein
the carbon-based film consists of at least one layer of cross-linked molecules selected from the group consisting of phenyl, biphenyl, terphenyl, quaterphenyl, naphthaline, pyrene, bipyridine, terpyridine, thiophene, bithienyl, terthienyl, pyrrole, and combinations thereof, the carbon-based film having a periphery and a center portion, the center portion being transparent to the radiation beam and having a thickness of between 0.1 nm and 10 nm; and
the support structure is coupled at least to the periphery of the carbon-based film.

2. The pellicle of claim 1, wherein the support structure further comprises a porous portion to which the carbon-based film is attached.

3. The pellicle of claim 1, further comprising at least one functionalised surface.

4. The pellicle of claim 1, further comprising at least one further film attached to the carbon-based film.

5. The pellicle of claim 4, wherein the at least one further film is selected from the group consisting of: a carbon-based film, an amorphous carbon film, a graphene layer, and a silicon film.

6. The pellicle of claim 1, wherein the carbon-based film is self-supporting.

7. The pellicle of claim 1, wherein the carbon-based film has a periphery portion and a center portion and wherein both the periphery portion and the center portion consist of the layer of cross-linked molecules.

8. A lithographic device comprising:
a radiation source for producing a radiation beam;
a patterning support configured to support a patterning device for imparting the radiation beam with a pattern;
a chamber located between the radiation source and the patterning support, wherein one of a plurality of walls defining the chamber consists of a carbon-based film having at least one layer of cross-linked molecules consisting of the group of phenyl, biphenyl, terphenyl, quaterphenyl, naphthaline, pyrene, bipyridine, terpyridine, thiophene, bithienyl, terthienyl, pyrrole, and combinations thereof, and having a thickness of between 0.1 nm and 10 nm.

9. The lithographic device of claim 8, wherein the carbon-based film is self-supporting.

10. The lithographic device of claim 8, wherein the carbon-based film has a periphery portion and a center portion and wherein both the periphery portion and the center portion consist of the layer of cross-linked molecules.

11. A method of manufacture of a pellicle for a lithographic device comprising:
providing a substrate;
adding carbon-containing compounds to a surface of the substrate;
cross-linking of the carbon-containing compounds, thus forming at least one carbon-based film, having a thickness of between 0.1 nm and 10 nm and at least one layer of cross-linked molecules selected from the group consisting of phenyl, biphenyl, terphenyl, quaterphenyl, naphthaline, pyrene, bipyridine, terpyridine, thiophene, bithienyl, terthienyl, pyrrole, and combinations thereof, on the surface of the substrate;
removing the at least one carbon-based film from the substrate;
providing a support structure; and
applying the at least one carbon-based film at least about a periphery portion onto the support structure.

12. The method of claim 11, wherein the removal of the at least one carbon-based film from the substrate comprises the removing of a part of the substrate such that a remaining part of the substrate comprises the support structure.

13. The method of claim 11, wherein the support structure is provided prior to the removing of the at least one carbon-based film from the substrate.

* * * * *